United States Patent [19]

Shibata et al.

[11] Patent Number: 6,033,927
[45] Date of Patent: Mar. 7, 2000

[54] METHOD FOR SEPARATING A SUBSTRATE OF A GROUP III NITRIDE SEMICONDUCTOR LIGHT-EMITTING DEVICE

[75] Inventors: Naoki Shibata; Atsuo Hirano; Toshiya Uemura, all of Aichi, Japan

[73] Assignee: Toyoda Gosei Co., Ltd., Aichi, Japan

[21] Appl. No.: 09/016,809

[22] Filed: Jan. 30, 1998

[51] Int. Cl.$^7$ .................................................. H01L 21/304
[52] U.S. Cl. .................. 438/33; 372/45; 438/47
[58] Field of Search ............................ 438/31–35, 42–46, 438/68, 461–465, FOR 386; 372/45

[56] References Cited

U.S. PATENT DOCUMENTS

| | | | |
|---|---|---|---|
| 5,604,763 | 2/1997 | Kato et al. | 372/45 |
| 5,811,319 | 9/1998 | Koike et al. | 438/46 |

FOREIGN PATENT DOCUMENTS

| | | |
|---|---|---|
| 55-009442 | 1/1980 | Japan . |
| 5-343742 | 12/1993 | Japan . |
| 7-131069 | 5/1995 | Japan . |

Primary Examiner—Olik Chaudhuri
Assistant Examiner—Anh Duy Mai
Attorney, Agent, or Firm—Pillsbury Madison & Sutro LLP

[57] ABSTRACT

A wafer is diced up to a depth of 15 $\mu$m from the surface of a sapphire substrate along a dicing line set in the center of a processed region between electrodes for respective devices by using a blade having a width narrower than the width of the processed region, so that separation grooves are formed. In the present invention, the first contact layer, the second contact layer, the p layer, the light-emitting layer and the n layer are arranged in a region between a side surface of the blade and a side wall of the electrode formation region. Accordingly, stress is concentrated into an intersection line of the electrode formation region and the side wall which is erected so as to be L-shaped. Thus, cracks generated at the time of dicing are formed-toward the intersection line. As a result, the cracks never enter into the electrode formation region and, accordingly, never enter into the lower portion of the electrode. Accordingly, the current path for the electrode is prevented from being disturbed by the cracks.

4 Claims, 6 Drawing Sheets

METHOD FOR SEPARATING A SUBSTRATE OF A GROUP III NITRIDE SEMICONDUCTOR LIGHT-EMITTING DEVICE

This application is related to Japan Application No. 8-271628, filed on Sep. 20, 1996, the contents of which are herein incorporated by reference.

BACKGROUND OF THE INVENTION

1. Field of the Invention

The present invention relates to a method for separating a substrate of a group III nitride semiconductor light-emitting device into a plurality of chips used in light-emitting devices such as blue light-emitting diodes, blue laser diodes, etc.

2. Description of the Related Art

FIG. 8 is a plan sectional view of a wafer showing the steps of a conventional separation method. FIG. 9 is a front sectional view taken along the line a9—a9 in FIG. 8, showing the steps of the conventional separation method.

As shown in FIG. 9, there is heretofore known a light emitting device using gallium nitride compound semiconductors in which: n layers 3 and 4, a light-emitting layer 5 and p layers 61, 62 and 63 are successively grown on a sapphire substrate 1. The light-emitting layer 5, the p layers 61, 62 and 63 and the n layer 4 are partially removed to partially expose the n layer 3. Electrodes 8 for the n layers 3 and 4 are formed on the thus exposed electrode-formation regions A, and electrodes 7 for the p layers 61, 62 and 63 are formed on upper surfaces of the player 63.

Japanese Unexamined Patent Publication No. Hei. 5-343742 describes a method for producing light-emitting device chips. This method is used in an etching process for forming the electrode formation regions A for the n layers. The method comprises the steps of: exposing the n layer 3 also in regions E to be processed by a blade 40 to perform device separation; dicing the n layer 3 up to the sapphire substrate 1 with the blade 40 in the exposed regions E to be processed; and then dicing or scribing the sapphire substrate 1 to separate the sapphire substrate 1 into respective chips.

In the separation method using the aforementioned method, etching is performed so that the electrode formation regions A for the n layer 3 and the regions E to be processed by the blade 40 become continuous, and dicing is performed along a processing line 20 in the regions E which are to be processed and in which the n layer 3 is exposed. In the dicing step, however, cracks C are generated in the n layer 3 because of the rotation force of the blade 40 so that the cracks C reach the lower portions of the electrodes 8. As a result, the cracks C are interposed in current paths for the n layer 3. Accordingly, the cracks C lower the quantity of supply current and cut off current paths, etc. Accordingly, the production yield, the light-emitting efficiency and the device life are lowered.

SUMMARY OF THE INVENTION

The present invention is designed to solve the aforementioned problems, and an object thereof is to prevent cracks generated at the time of dicing with a blade from reaching device regions to thereby attain improvement in production yield, light-emitting efficiency and device life.

According to the present invention, there is provided a method for separating a substrate of a group III nitride semiconductor light-emitting device having a substrate, a light-emitting layer for emitting light, a first layer formed on a nearer side to the substrate and exhibiting a first conduction type, and a second layer formed on a farther side from the substrate and exhibiting a second conduction type different from the first conduction type. The light-emitting layer is disposed between the first and second layers so as to be supplied with a current from the first and second layers. The respective layers are formed of group III nitride semiconductors by a method comprising the steps of: etching the second layer and light-emitting layer in an electrode formation region from the first layer to thereby remove the second layer and the light-emitting layer to expose the electrode formation region; forming a first electrode for the first layer in the exposed electrode formation region in a manner so that a range of the first electrode is narrower than the electrode formation region; and dicing in a position where the light-emitting layer and the second layer exist between a peripheral portion of the electrode formation region and a side surface of a blade.

The light-emitting layer and the first layer may be removed in the dicing step so that a separation groove is formed in a front surface of the substrate. The method further comprises: scribing a position in a rear surface of the substrate corresponding to the separation groove, and separating the substrate into chips by applying a load to the substrate.

A peripheral portion of a light-emitting region except for a region to be processed by the blade may be also etched simultaneously in the etching step, and the dicing is performed ink a position where the light-emitting layer and the second layer remain on opposite sides of the blade, by using a blade having a narrower width than the width of the region to be processed.

The substrate may be a sapphire substrate.

The light-emitting layer and the second layer exist between the periphery of the exposed electrode formation region and the side surface of the blade at the time of dicing. That is, the electrode formation region is thinner than its periphery, and the peripheral portion is surrounded by side walls of the light-emitting layer and the second layer so that an L-shaped level difference is generated. Because of this level difference, stress can be concentrated into a corner portion of the level difference so that cracks caused by distortion applied at the time of dicing can be confined between a side surface of a top end portion of the blade and the corner portion of the level difference. Accordingly, because cracks are suppressed from being extended to the lower portion of the first electrode formed on the electrode formation region, cracks are prevented from being interposed in the current path. Accordingly, production yield, light-emitting efficiency and device life are improved.

The dicing may be performed until a separation groove is formed in the front surface of the substrate. That is, a so-called half cutting is performed and a position on the rear surface of the substrate corresponding to the separation groove is scribed so that the substrate is separated into respective chips when a load is applied, to the substrate. Accordingly, as compared with the case where the substrate is cut perfectly by dicing, the load on the blade is reduced so that cracks can be suppressed from being generated and the life of the blade can be improved.

The light-emitting layer and the second layer in the periphery of the light-emitting region except the region to be processed by the blade may be removed simultaneously by etching to expose the electrode formation region for the first layer. Accordingly, a groove in which the light-emitting layer and the second layer are absent is formed between the region to be processed by the blade and the light-emitting region. Further, the dicing is performed in a position where the light-emitting layer and the second layer remain on the opposite sides of the blade by using a blade having a narrower width than the width of the region to be processed. As a result, the light-emitting layer and the second layer are present between the opposite side surfaces of the blade and the groove surrounding the light-emitting region. That is, the electrode formation region and the groove surrounding the light-emitting region are thinner than their periphery, and the peripheral portion is surrounded by side walls of the light-emitting layer and the second layer so that an L-shaped level difference is generated. Because of this level difference, stress can be concentrated into a corner portion of the level difference so that cracks caused by distortion applied at the time of dicing can be confined between the opposite side surfaces of a top end portion of the blade and the corner portion of the level difference. Accordingly, because cracks are suppressed from being extended to the lower portion of the first electrode formed on the electrode formation region and from being extended to the lower portion of the light-emitting region, the harmful influence of cracks on the current path is prevented. Accordingly, production yield, light-emitting efficiency, and device life are improved.

In the present invention, the substrate is a sapphire substrate. The method of the present invention is effective for cutting the sapphire substrate which is fragile.

DETAILED DESCRIPTION OF THE PREFERRED EMBODIMENTS

The present invention will be described below on the basis of specific embodiments thereof.

Figure 4:
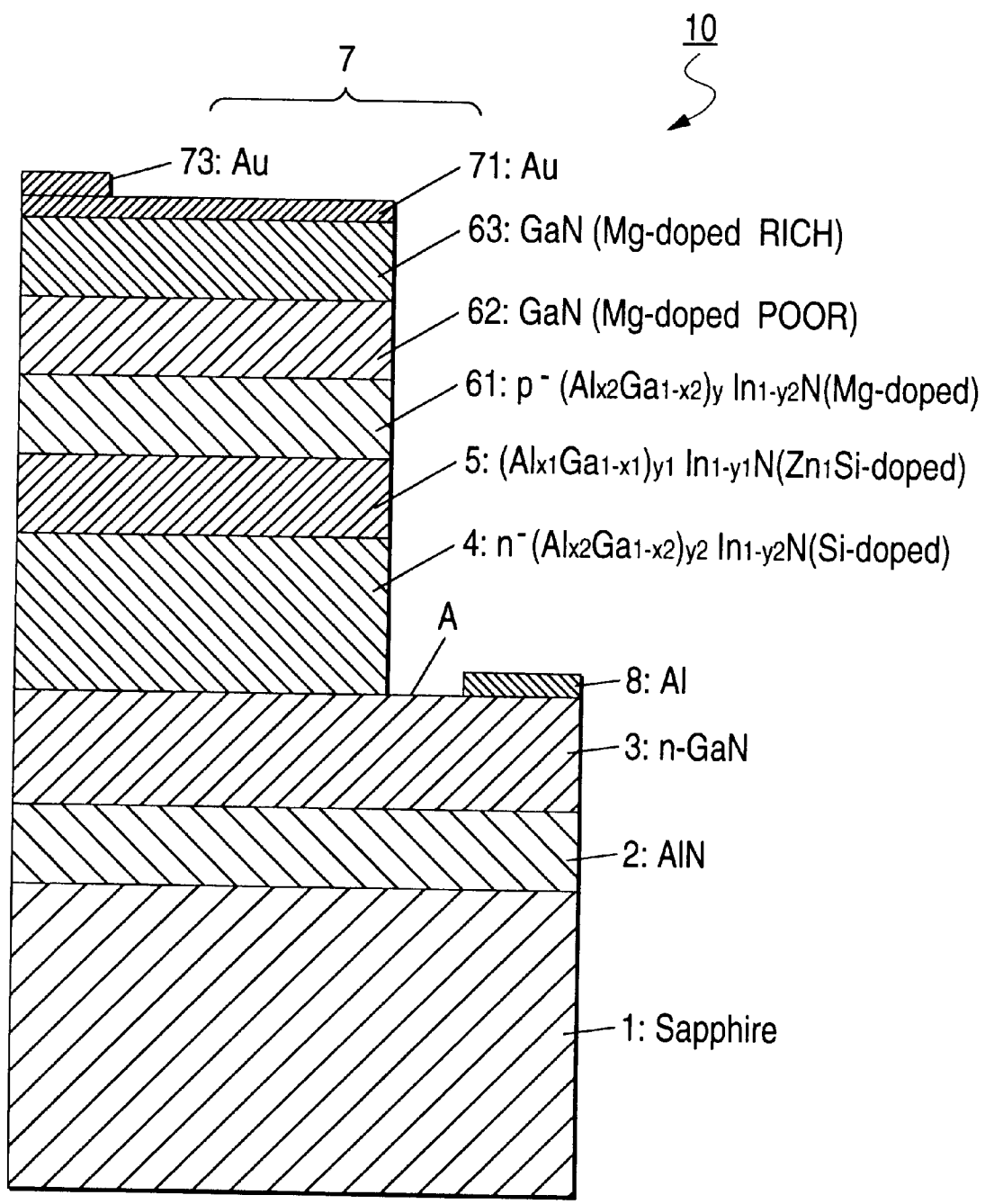
FIG. 4 is a sectional view showing the configuration of a light-emitting diode formed on a substrate in the first embodiment.

In FIG. 4, a light-emitting diode 10 has a sapphire substrate 1 on which a 500 Å AlN buffer layer 2 is formed. An n layer 3 of silicon-doped GaN with a film thickness of about 2.0 $\mu$m and with an electron concentration of $2\times10^{18}$/cm$^3$ is formed on the buffer layer 2. An n layer 4 of silicon-doped $(Al_{x2}Ga_{1-x2})_{y2}In_{1-y2}N$ with a film thickness of about 2.0 $\mu$m and with an electron concentration of $2\times10^{18}$/cm$^3$, a light-emitting layer 5 of zinc (Zn) and silicon-doped $(Al_{x1}Ga_{1-x1})_{y1}In_{1-y1}N$ with a film thickness of about 0.3 $\mu$m, a p layer 61 of magnesium-doped $(Al_{x2}Ga_{1-x2})_{y2}In_{1-y2}N$ with a film thickness of about 1.0 $\mu$m, with a hole concentration of $5\times10^{17}$/cm$^3$ and with a magnesium concentration of $1\times10^{20}$/cm$^3$, a second contact layer 62 of magnesium-doped GaN with a film thickness of about 0.2 $\mu$m, with a hole concentration of $5\times10^{17}$/cm$^3$ and with a magnesium concentration of $1\times10^{20}$/cm$^3$, and a first contact layer 63 of magnesium-doped GaN with a film thickness of about 500 Å, with a hole concentration of $2\times10^{17}$/cm$^3$ and with a magnesium concentration of $2\times10^{20}$/cm$^3$ are successively formed on the n layer 3 except in the electrode formation region A on which an electrode 8 is to be formed. In the above structure, the n layers 3, and 4 constitute a first layer which exhibits a first conduction type. The p layer 61, the second contact layer 62, and the first contact layer 63 constitute a second layer which exhibits a second conduction type different from the first conduction type of the first layer.

Further, an electrode 7 is formed to be connected to the first contact layer 63 and the electrode 8 is formed on the electrode formation region A which is an exposed surface of the n layer 3. The electrode 7 has a layer 71 of gold (Au) which is formed on the first contact layer 63 so that the layer 71 has a uniform thickness of 60 Å. This layer 71 functions as a transparent electrode. Further, a 1.5 $\mu$m-thick layer 73 of gold (Au) which functions as a pad for bonding a wire thereto is partially formed on the layer 71.

Further, the electrode 8 is constituted by a 1.5 $\mu$m-thick layer of aluminum (Al) joined onto the n layer 3.

A method for producing the light-emitting diode 10 having this structure will be described below.

The aforementioned light-emitting diode 10 was produced on the basis of vapor growth by an organometallic compound vapor growth method (hereinafter referred to as "MOVPE").

The gases used were $NH_3$, a carrier gas $H_2$ or $N_2$, trimethylgallium ($Ga(CH_3)_3$) (hereinafter referred to as "TMG"), trimethylaluminum ($Al(CH_3)_3$) (hereinafter referred to as "TMA"), trimethylindium ($In(CH_3)_3$) (hereinafter referred to as "TMI"), diethylzinc ($C_2H_5)_2Zn$ (hereinafter referred to as "DEZ"), silane ($SiH_4$) and cyclopentadienylmagnesium ($Mg(C_5H_5)_2$) (hereinafter referred to as "$CP_2Mg$").

First, a single-crystal sapphire substrate 1 having, as a main surface, a plane cleaned by means of organic cleaning and heating was mounted on a susceptor put in a reaction chamber of an MOVPE apparatus. Then, the sapphire substrate 1 was vapor etched at a temperature of 1100° C. while $H_2$ was introduced into the reaction chamber at the flow rate of 2 liter/min under the ordinary pressure.

Then, the temperature was reduced to 400° C., and 20 liter/min of $H_2$, 10 liter/min of $NH_3$ and $1.8\times10^{-5}$ mol/min of TMA were supplied so that a buffer layer 2 of AlN was formed to have a thickness of about 500 Å. Then, while the temperature of the sapphire substrate 1 was kept at 1150° C., 20 liter/min of $N_2$ or $H_2$, 10 liter/min of $NH_3$, $1.12\times10^{-4}$ mol/min of TMG and $10\times10^{-9}$ mol/min of silane diluted to 0.86 ppm with $H_2$ gas were introduced so that an n layer 3 of silicon-doped GaN with a film thickness of about 2.2 $\mu$m and with an electron concentration of $2\times10^{18}$/cm$^3$ was formed.

After the aforementioned n layer 3 was formed, in the succeeding step, the temperature of the sapphire substrate 1 was kept at 1000° C., and 10 liter/min of $N_2$ or $H_2$, 10 liter/min of $NH_3$, $1.12 \times 10^{-4}$ mol/min of TMG, $0.47 \times 10^{-4}$ mol/min of TMA, $0.1 \times 10-4$ mol/min of TMI, and $10 \times 10^{-9}$ mol/min of silane diluted to 0.86 ppm with $H_2$ gas were introduced so that an n layfer 4 of silicon-doped $(Al_{0.47}Ga_{0.53})_{0.9}IN_{0.1}N$ with a film thickness of about 0.5 $\mu$m and with an electron concentration of $1 \times 10^{18}/cm^3$ was formed.

Next, the temperature was kept at 850° C., and 20 liter/min of $N_2$ or $H_2$, 10 liter/min of $NH_3$, $1.53 \times 10^{-4}$ mol/min of TMG, $0.47 \times 10^{-4}$ mol/min of TMA, $0.02 \times 10-4$ mol/min of TMI, $2.0 \times 10^{-4}$ mol/min of, DEZ, and $10 \times 10^{-8}$ mol/min of silane diluted to 0.86 ppm with $H_2$ gas were introduced for 30 minutes so that a light-emitting layer 5 of zinc (Zn) and silicon (Si)-doped $(Al_{0.3}Ga_{0.7})_{0.94}IN_{0.06}N$ with a film thickness of about 0.3 $\mu$m was formed. The zinc (Zn) concentration and the silicon (Si) concentration in the light-emitting layer 5 were both $5 \times 10^{12}/cm^3$.

Next, the temperature was kept at 1100° C., and 20 liter/min of $N_2$ or $H_2$, 10 liter/min of $NH_3$, $1.12 \times 10^{-4}$ mol/min of TMG, $0.47 \times 10^{-4}$ mol/min of TMA, $0.1 \times 10^{-4}$ mol/min of TMI, and $2 \times 10^{-4}$ mol/min of $CP_2Mg$ were introduced so that a p layer 61 of magnesium (Mg)-doped $(Al_{0.47}Ga_{0.53})_{0.9}IN_{0.1}N$ with a film thickness of about 1.0 $\mu$m was formed. The magnesium concentration of the p layer 61 was $1 \times 10^{20}/cm^3$. In this condition, the p layer 61 was still an electrical insulator having a specific resistance not smaller than $10^8$ 106 cm. Then, the temperature was kept at 1100° C., and 20 liter/min of $N_2$ or $H_2$, 10 liter/min of $NH_3$, $1.12 \times 10^{-4}$ mol/min of TMG, and $2 \times 10^{-4}$ mol/min of $CP_2Mg$ were introduced so that a second contact layer 62 of magnesium (Mg)-doped GaN with a film thickness of about 0.2 $\mu$m was formed. The magnesium concentration of the second contact layer 62 was $1 \times 10^{20}/cm^3$. In this condition, the second contact layer 62 was still an electrical insulator having a specific resistance not smaller than $10^8$ $\Omega$cm. Next, the temperature was kept at 1100° C., and 20 liter/min of $N_2$ or $H_2$, 10 liter/min of $NH_3$, $1.12 \times 10^{-4}$ mol/min of TMG, and $4 \times 10^{-4}$ mol/min of $CP_2Mg$ were introduced so that a first contact layer 63 of magnesium (Mg)-doped GaN with a film thickness of about 500 Å was formed. The magnesium concentration of the first contact layer 63 was $2 \times 10^{20}/cm^3$. In this condition, the first contact layer 63 was still an electrical insulator having a specific resistance not smaller than $10^8$ $\Omega$cm.

Then, heat at 450° C. was applied for 45 minutes, so that the first contact layer 63, the second contact layer 62 and the p layer 61 became p conduction type semiconductors having hole concentrations of $2 \times 10^{17}/cm^3$, $5 \times 10^{17}/cm^3$ and $5 \times 10^{17}/cm^3$ and having specific resistances of 2 $\Omega$cm, 0.8 $\Omega$cm and 0.8 $\Omega$cm, respectively. Thus, a multilayer-structure wafer was obtained.

Then, a 2000 Å-thick $SiO_2$ layer was formed on the first contact layer 63 by sputtering. Then, a photo resist was applied onto the $SiO_2$ layer. Further, the photo resist in the electrode formation region A in which the n layer 3 was to be exposed was photolithographically removed from the first contact layer 63.

Figure 1:
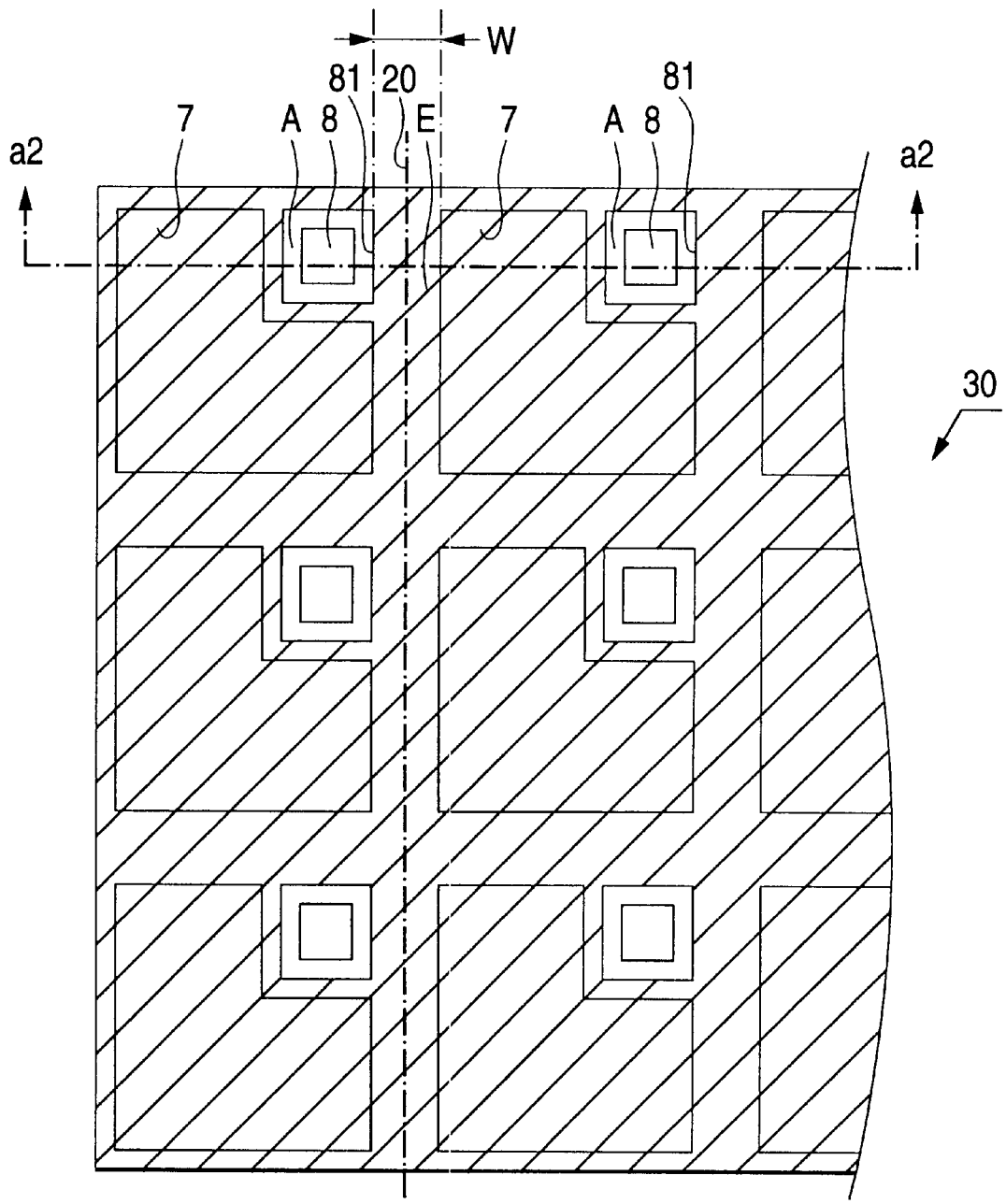
FIG. 1 is a plan sectional view of a wafer having semiconductor light-emitting devices formed therein, and shows a separation method in accordance with a first embodiment of the present invention.
Figure 2:
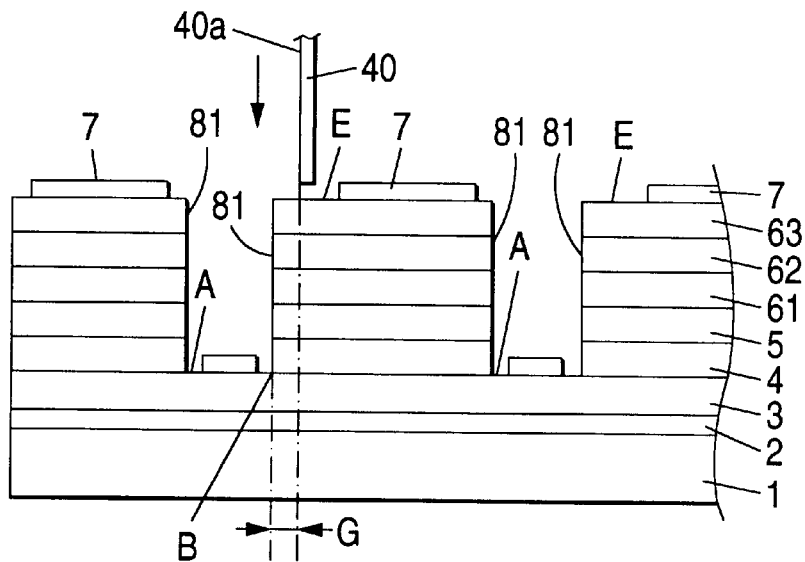
FIG. 2 is a front sectional view taken along the line a2—a2 in FIG. 1, and shows the steps of the separation method in the first embodiment.

Then, the $SiO_2$ layer not covered with the photo resist was removed with a sodium hydrofluoride etching solution. Then, the first contact layer 63, the second contact layer 62, the p layer 61, the light-emitting layer 5 and the n layer 4 as portions covered neither with the photo resist nor with the $SiO_2$ layer were dry-etched with 10 ml/min of $BCl_3$ gas supplied at the degree of vacuum of 0.04 Torr at the high-frequency electric power of 0.44 W/cm$^2$ and then were dry-etched with Ar. By this process, the surface of the n layer 3 was exposed to thereby form a rectangular electrode formation region A as shown in FIG. 1. As shown in FIGS. 1 and 2, the electrode formation region A was surrounded by side walls 81 of the first contact layer 63, the second contact layer 62, the p layer 61, the light-emitting layer 5 and the n layer 4.

Then, the $SiO_2$ layer remaining on the first contact layer 63 was removed with hydrofluoric acid. Then, as shown in FIG. 4, a layer 71 of gold (Au) with a thickness of 60 Å was evenly formed as a transparent electrode on the surface of the first contact layer 63. Then, a layer 73 of gold (Au) with a thickness of 1.5 $\mu$m was further formed as a bonding pad on the layer 71.

On the other hand, a layer of aluminum (Al) with a thickness of 1.5 $\mu$m was formed as an electrode 8 for the n layer 3.

Then, alloying was applied at 600° C. for 1 minute, so that a wafer 30 having the shape in which light-emitting diodes 10 shown in FIG. 4 were arranged two-dimensionally as shown in FIG. 1 was formed.

Figure 3:
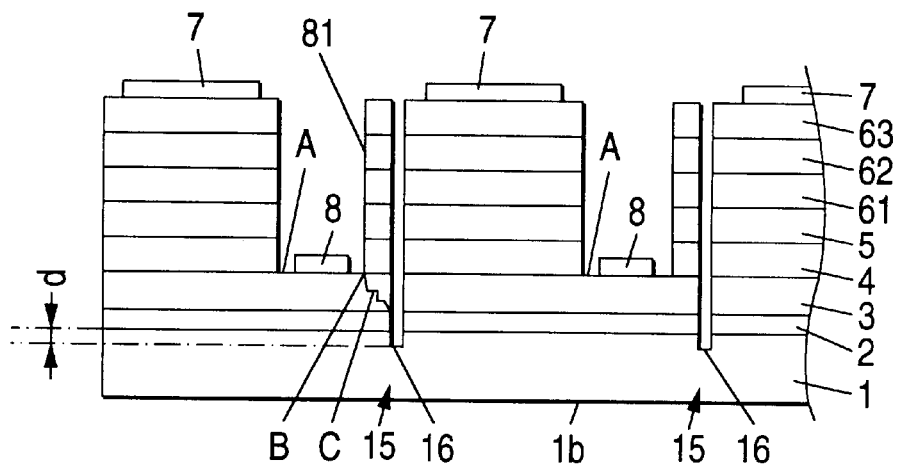
FIG. 3 is a front sectional view of the wafer taken along the line a2—a2 in FIG. 1, and shows the steps of the separation method in the first embodiment.

Then, the wafer 30 shown in FIG. 1 was diced up to the depth of 15 $\mu$m from the surface of the sapphire substrate 1 along the dicing line 20 set in the center of the processed region E between electrodes 7 for respective devices by using a blade 40 having a width narrower than the width W of the processed region E as shown in FIG. 2, so that separation grooves 16 were formed as shown in FIG. 3. In this occasion, as shown in FIG. 2, the first contact layer 63, the second contact layer 62, the p layer 61, the light-emitting layer 5 and the n layer 4 existed in a region G between a side surface 40a of the blade 40 and a side wall 81 of the electrode formation region A. Accordingly, stress was concentrated into an intersection line B of the electrode formation region A and the side wall 81 which was erected so as to be L-shaped, so that cracks C generated at the time of dicing were formed toward the intersection line B. As a result, the cracks C never entered into the electrode formation region A and, accordingly, never entered into the lower portion of the electrode 8. Accordingly, the current path for the electrode 8 was prevented from being disturbed by the cracks C.

Incidentally, as shown in FIG. 3, the depth d of the separation groove 16 in the sapphire substrate 1 is preferably in a range of from 10 to 20 $\mu$m.

Then, as shown in FIG. 3, scribing lines 15 were formed in the rear surface 1b of the sapphire substrate 1 so as to be located in positions opposite to the separation grooves 16. The wafer 30 was loaded by a roller so as to be separated into chips.

Thus, each of the formed chips for light-emitting diodes 10 was mounted on a lead frame. The gold layer 73 of the electrode 7 and the electrode 8 were bonded to lands of the lead frame by gold wire. In the aforementioned light-emitting diode 10, the contact resistance of the electrode 8 with respect to the n layer 3 was not larger than $10^{-5}$ $\Omega$cm. Furthermore, when the bonding strength was confirmed by a wire pulling test, a sufficient bonding strength was obtained. Furthermore, the ohmic characteristic was good.

A second embodiment will be described below.

Figure 5:
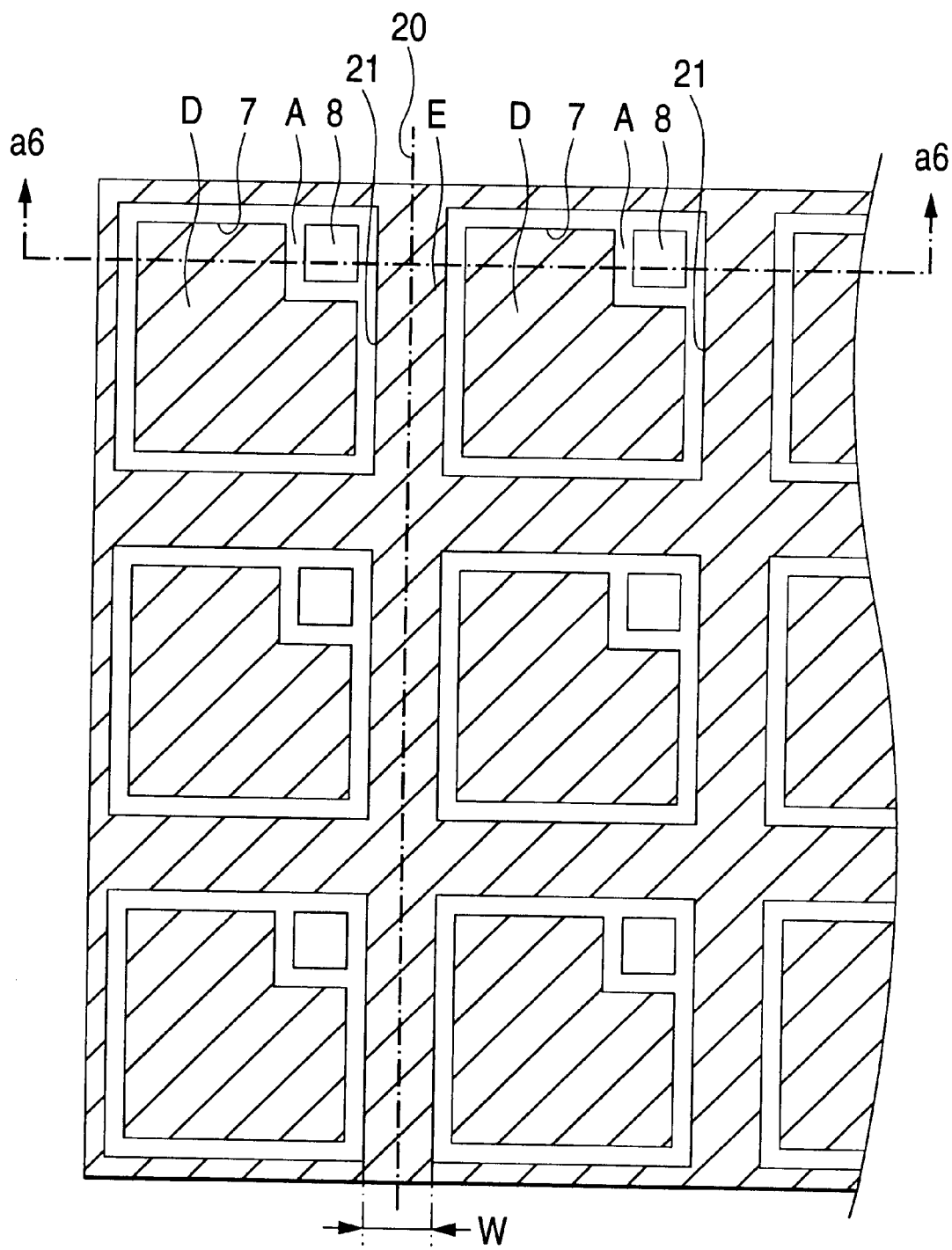
FIG. 5 is a plan sectional view of a wafer having semiconductor light-emitting devices formed, and shows a separation method according to a second embodiment of the present invention.
Figure 6:
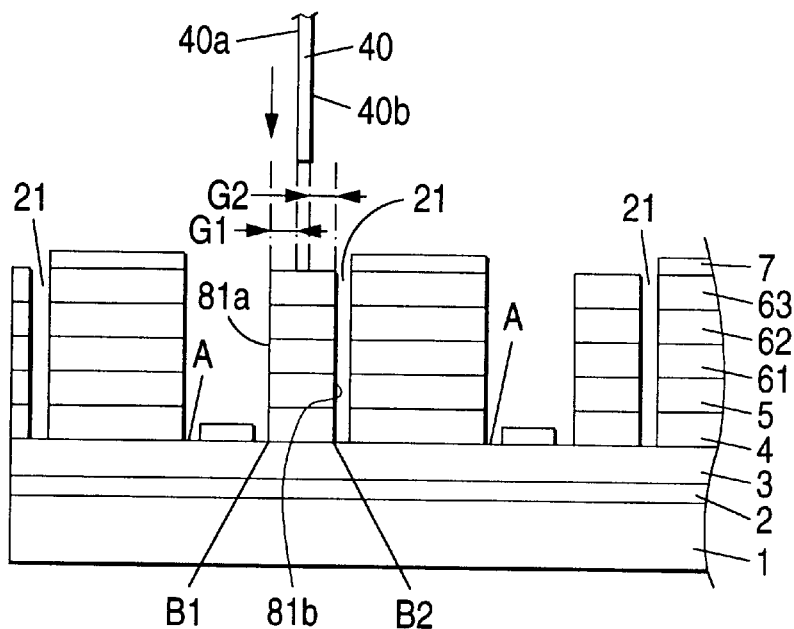
FIG. 6 is a front sectional view of the wafer taken along the line a6—a6 in FIG. 5, and shows the steps of the separation method in the second embodiment.

In this embodiment, as shown in FIGS. 5 and 6, grooves 21 in which the n layer 3 was exposed were formed around light-emitting regions D which are equivalent to the lower portions of the electrodes 7 in the etching process of forming the electrode formation regions A for the n layer 3. Furthermore, the first contact layer 63, the second contact layer 62, the p layer 61, the light-emitting layer 5 and the n layer 4 are present in the processed regions E to be diced with the blade 40. The second embodiment differs from the first embodiment in that the grooves 21 are formed in surroundings of the light-emitting regions D.

Figure 7:
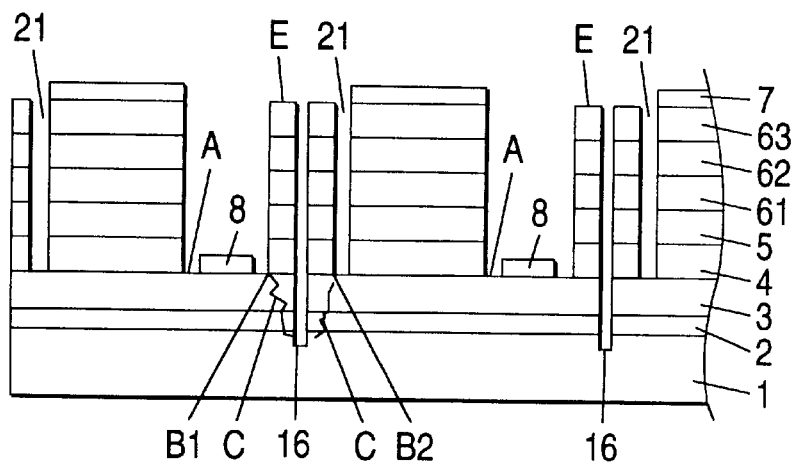
FIG. 7 is a front sectional view of the wafer taken along the line a6—a6 in FIG. 5, and shows the steps of the separation method in the second embodiment.
Figure 8:
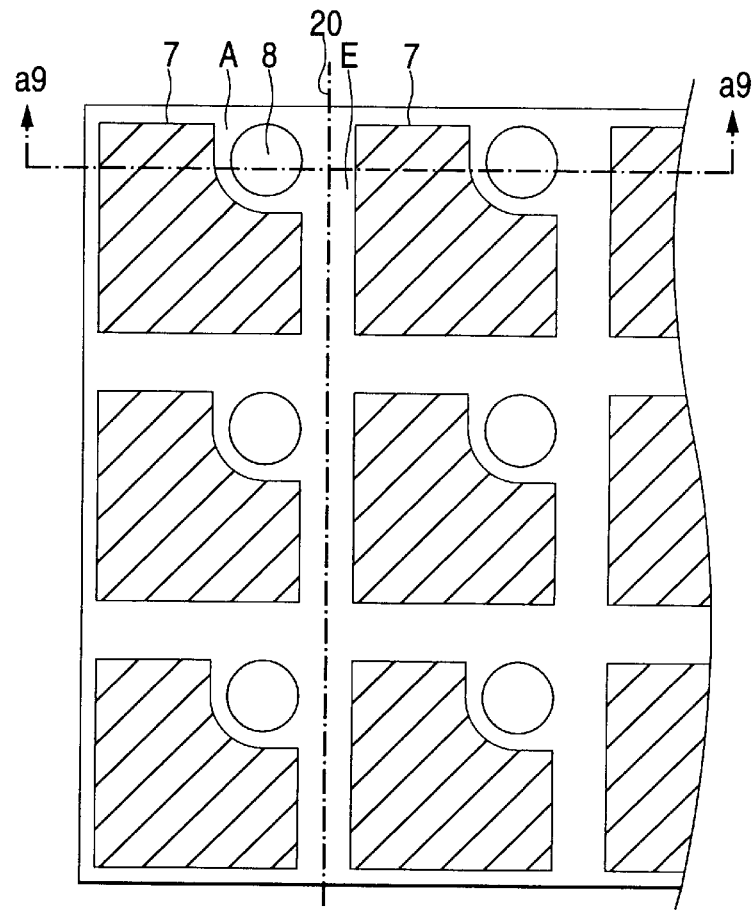
FIG. 8 is a plan sectional view of a wafer showing the steps of a conventional separation method.
Figure 9:
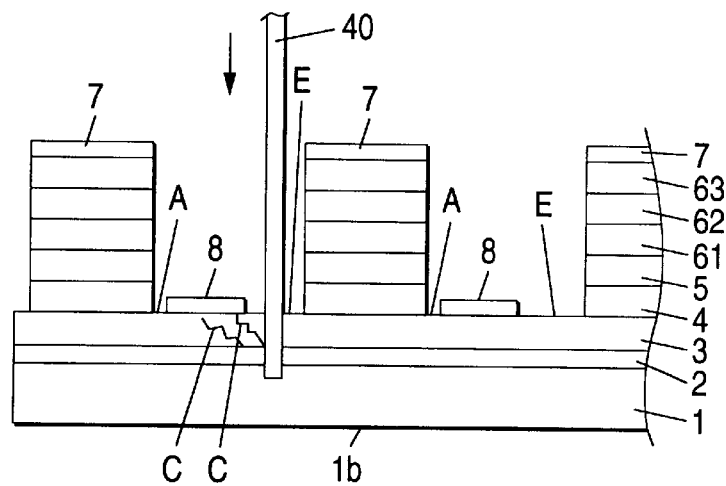
FIG. 9 is a front sectional view of the wafer taken along the line a9—a9 in FIG. 8, and shows the steps of conventional separation method.

After being formed as described above, as shown in FIG. 5, the wafer 30 was diced up to the depth of 15 μm from the surface of the sapphire substrate 1 along the dicing line 20 set in the center of the processed region E between electrodes 7 of respective devices, by using a blade 40 having narrower width than the width W of the processed region E as shown in FIG. 6, so that separation grooves 16 were formed as shown in FIG. 7.

In this arrangement, as shown in FIG. 6, the first contact layer 63, the second contact layer 62, the p layer 61, the light-emitting layer 5 and the n layer 4 are present in regions G1 and G2 between a side surface 40a of the blade 40 and a side wall 81a of the electrode formation region A and between a side surface 40b of the blade 40 and a side wall 81b of the electrode formation region A in the processed region E.

Accordingly, stress is concentrated into respective intersection lines B1 and B2 of the electrode formation region A and the side walls 81a and 81b which are erected so as to be L-shaped, so that cracks C generated in the opposite sides of the blade 40 at the time of dicing are formed toward the intersection lines B. As a result, cracks C never enter into the lower portions of the light-emitting regions D existing in the opposite sides of the processed region E and into the lower portion of the electrode formation region A existing in a single side of the processed region E. Accordingly, the current path is prevented from being disturbed by the cracks C. Furthermore, the light-emitting regions D are never destroyed by the cracks C. Accordingly, the production yield, light-emitting efficiency and device life of the light-emitting device are improved.

Incidentally, in the processed region E in the first and second embodiments, the width of each of the region G and regions G1 and G2 in which the first contact layer 63, the second contact layer 62, the p layer 61, the light-emitting layer 5 and the n layer 4 remain are preferably in a range of from 2 μm to 40 μm. If the width is narrower than 2 μm, the effect of confining the cracks into those regions is undesirably small. If the width is wider than 40 μm, the number of light-emitting devices which can be removed from one wafer is reduced undesirably.

Constituent components of the respective layers and the proportion thereof are not limited to those described in the aforementioned embodiments. For example, two, three or four components of group III nitride semiconductors can be used. Furthermore, a SiC substrate, or the like, other than the sapphire substrate can be used as a substrate.

Although the above description describes the case where the shape of each of the electrodes 7 and 8 is rectangular, the electrode 8 may be circularly shaped and the electrode 7 may be shaped into a circular arc corresponding to the electrode 8.

What is claimed is:

1. A method for separating a group III nitride semiconductor light-emitting device including:
   a substrate;
   a light-emitting layer for emitting light;
   a first layer formed on a nearer side to said substrate and exhibiting a first conduction type; and
   a second layer formed on a farther side from said substrate and exhibiting a second conduction type different from said first conduction type;
   wherein said light-emitting layer is disposed between said first and second layers so as to be supplied with a current from said first and second layers, and the first, second and light-emitting layers are formed of group III nitride semiconductors; and
   the method comprising the steps of:
      etching said second layer and light-emitting layer in an electrode formation region from said first layer to thereby remove said second layer and said light-emitting layer to make said electrode formation region be exposed;
      forming a first electrode on said first layer in said exposed electrode formation region, so that a width of said first electrode is narrower than said electrode formation region; and
      dicing said light-emitting device with a blade in a position of said light-emitting device so that a portion of said light-emitting layer and a portion of said second layer exist between a peripheral portion of said electrode formation region and a side surface of said blade;
      wherein said dicing step is executed while leaving said portions of said light-emitting layer and said second layer adjacent to said peripheral portion of said electrode.

2. The method for separating a group III nitride semiconductor light-emitting device according to claim 1, wherein said second layer, said light-emitting layer and said first layer are removed in the dicing step so that a separation groove is formed in a front surface of said substrate, and the method further comprises: scribing a position in a rear surface of said substrate corresponding to said separation groove, and separating said substrate into chips by applying a load to said substrate.

3. A method for separating a group III nitride semiconductor light-emitting device including:
   a substrate;
   a light-emitting layer for emitting light;
   a first layer formed on a nearer side to said substrate and exhibiting a first conduction type; and
   a second layer formed on a farther side from said substrate and exhibiting a second conduction type different from said first conduction type;
   wherein said light-emitting layer is disposed between said first and second layers so as to be supplied with a current from said first and second layers, and the first, second and light-emitting layers are formed of group III nitride semiconductors; and
   the method comprising the steps of:
      etching said second layer and light-emitting layer in an electrode formation region from said first layer to thereby remove said second layer and said light-emitting layer to make said electrode formation region be exposed;
      forming a first electrode on said first layer in said exposed electrode formation region, so that a width of said first electrode is narrower than said electrode formation region; and
      dicing said light-emitting device with a blade in a position of said light-emitting device so that a portion of said light-emitting layer and a portion of said second layer exist between a peripheral portion of said electrode formation region and a side surface of said blade;

wherein a periphery portion of a light-emitting region except for a region to be processed by said blade is also etched simultaneously in the etching step, and said position of the dicing is located so that portions of said light-emitting layer and portions of said second layer remain on opposite sides of said blade by using said blade having a narrower width than the width of said region to be processed.

4. The method for separating a group III nitride semiconductor light-emitting device according to claim 1, wherein said substrate is a sapphire substrate.

* * * * *